United States Patent [19]

Paz De Araujo et al.

[11] Patent Number: 5,444,290
[45] Date of Patent: Aug. 22, 1995

[54] METHOD AND APPARATUS FOR PROGRAMMING ANTIFUSE ELEMENTS USING COMBINED AC AND DC ELECTRIC FIELDS

[75] Inventors: Carlos A. Paz De Araujo; Larry D. McMillan; Joseph D. Cuchiaro, all of Colorado Springs, Colo.

[73] Assignee: Symetrix Corporation, Colorado Springs, Colo.

[21] Appl. No.: 249,524

[22] Filed: May 26, 1994

[51] Int. Cl.⁶ .......................................... H01L 27/02
[52] U.S. Cl. ........................... 257/530; 365/96; 437/922
[58] Field of Search ............... 257/530, 50; 365/96; 437/170, 172, 922

[56] References Cited

U.S. PATENT DOCUMENTS

| | | | |
|---|---|---|---|
| 4,322,822 | 3/1982 | McPherson | 365/182 |
| 4,488,262 | 12/1984 | Basire et al. | 365/104 |
| 4,499,557 | 2/1985 | Holmberg et al. | 365/163 |
| 4,502,208 | 3/1985 | McPherson | 29/584 |
| 4,507,757 | 3/1985 | McElroy | 365/104 |
| 4,538,884 | 9/1985 | Masaki et al. | 350/361 |
| 4,543,594 | 9/1985 | Mohsen et al. | 357/51 |
| 4,899,205 | 2/1990 | Hamdy et al. | 357/51 |
| 5,126,282 | 6/1992 | Chiang et al. | 437/172 |
| 5,248,632 | 9/1993 | Tung et al. | 437/195 |
| 5,250,459 | 10/1993 | Lee | 437/52 |
| 5,250,464 | 10/1993 | Wong et al. | 437/170 |
| 5,316,971 | 5/1994 | Chiang et al. | 437/170 |
| 5,371,414 | 12/1994 | Galbraith | 365/96 |
| 5,373,169 | 12/1994 | McCollum et al. | 257/530 |

*Primary Examiner*—J. Carroll
*Attorney, Agent, or Firm*—Duft, Graziano & Forest

[57] ABSTRACT

An antifuse element has a dielectric layer comprising materials whose dielectric constant increases in the presence of a DC electric field, such as a ferroelectric. An applied AC electric field and a DC electric field breaks down the dielectric material to form a conductive filament. The AC electric field causes the physical reorientation of the electric dipole of the molecules in the ferroelectric material which creates heat within the ferroelectric material. The DC electric field enhances the heating effect of the AC electric field by enlarging the electric dipole of the ferroelectric molecules. The synergy of the two electric fields permits programming antifuse elements of the present invention by applying DC electric fields as low as 2 volts amplitude.

19 Claims, 2 Drawing Sheets

METHOD AND APPARATUS FOR PROGRAMMING ANTIFUSE ELEMENTS USING COMBINED AC AND DC ELECTRIC FIELDS

BACKGROUND OF THE INVENTION

1. Field of the Invention

This invention relates to integrated circuit technology and, more specifically, to antifuse devices which provide an electrically programmable connection between two unconnected points of a circuit. More specifically, the present invention relates to a method and apparatus for programming antifuse elements by applying a combination of AC and DC electric fields.

2. Related Art

This application relates to co-pending patent application Ser. No. 08/249,870 filed herewith, hereby incorporated by reference, and assigned to Symetrix Corporation.

3. Brief Description of the Prior Art

It is known to provide programmable integrated circuits which permit a user to customize the application of the circuit by programming ("blowing") electronic interconnections within the circuit to fulfill a specific application need. Integrated circuits such as Programmable Array Logic (PALs), Programmable Logic Devices (PLDs), Field Programmable Gate Arrays (FPGAs), and Programmable Read-Only Memories (PROM's) are typical of such programmable devices. These devices provide arrays of programmable elements which a user may elect to connect or disconnect by electrical means. "Fusible" devices are manufactured with each element initially connected and are programmed by applying sufficient current to an element to "blow" the fuse thereby disconnecting the element. "Antifuse" devices are manufactured with each element initially unconnected and are programmed by applying an electrical field across an element sufficient to cause a breakdown of an insulating material within an element. The breakdown of the insulating layer forms a conductive filament connecting the two previously unconnected points of the element.

A large class of such devices are one-time programmable (OTP) devices in that each element may be programmed only once to meet the requirements of a particular application. Once programmed, the element cannot be changed again. Most antifuse devices use a dielectric layer of material between the unconnected contacts to provide the electrical insulation between the contacts. In an electric field of sufficient strength, the dielectric material heats to the point of breakdown and forms a conductive filament through an aperture in the dielectric material. This conductive filament connects the two previously unconnected contacts of the programmable antifuse element. Prior designs have taught the use of exclusively DC electric fields to program an antifuse element.

Basire et al. in U.S. Pat. No. 4,488,262 (issued Dec. 11, 1984) teach the design of a PROM device implemented with an array of antifuse elements. Basire et al. disclose a device embodying a two dimensional array of antifuse elements with intersecting row and column electrodes disposed across the insulative layer of each antifuse element. An electric field is controllably applied across each antifuse element to be programmed. The field is applied to the row electrode and column electrode which intersect at the antifuse element to be programmed. A sufficiently large electric field breaks down the insulative layer between the two intersecting electrodes to form a conductive filament through the insulative layer.

It is desirable to use materials for the insulating layer which have high resistivity in the unprogrammed state and yet breakdown to form a conductive filament of low resistivity. However, such materials have presented problems in prior designs. Although it is desirable to maintain a high resistivity in the unprogrammed state, a high dielectric constant of the insulating material in the unprogrammed state requires a correspondingly high DC electric field amplitude to force the breakdown of the insulating material. When the required field amplitude rises too high for practical applications, some prior designs have taught the use of dopants applied to the electrodes or the insulating layer to improve conductivity. Hamdy et al. teach the use of arsenic dopants applied to one or both electrodes in U.S. Pat. No. 4,889,205 (issued Feb. 6, 1990). The arsenic is intended to reduce the resistivity of the conductive filament formed by the breakdown of the insulative layer. Similarly, Lee teaches in U.S. Pat. No. 5,250,459 (issued Oct. 5, 1993) the use of antimony as a dopant to be applied to one or both electrodes. The antimony flows into the conductive filament when formed by the breakdown of the insulative layer. However, these approaches typically alter both the programmed and unprogrammed resistivity.

4. Solution to the Problem

The present invention teaches the use of a combination of AC and DC electric fields to break down the dielectric layer to form a conductive filament between two previously unconnected electrodes within the element. That is, an AC electric field is first applied across the antifuse element, followed by a DC electric field which causes the dielectric material to break down and form a conductive filament connecting the two previously unconnected electrodes. Materials such as ferroelectrics and perovskites exhibit the property that their dielectric constant rises significantly in the presence of a DC electric field. The high dielectric constant of these materials increases the power dissipated through dielectric heating within the material in response to an applied AC electric field. The combined effects of the AC and DC electric fields breaks down the ferroelectric material more easily than could either field alone.

The application of ferroelectric and other similar materials in the dielectric layer of antifuse elements is recited in co-pending U.S. patent application Ser. No. 08/249,870.

The present invention is applicable to dielectric layer materials in which the dielectric constant increases with the application of a DC electric field. The dielectric heating effect of the AC electric field is enhanced by the increase in the dielectric constant caused by the simultaneous application of a DC electric field. In materials with electric dipole properties, such as ferroelectrics, the application of a DC electric field increases the dielectric constant so that an AC electric field will cause sufficient dielectric heating to breakdown the material.

DETAILED DESCRIPTION OF THE DRAWING

Figure 1:
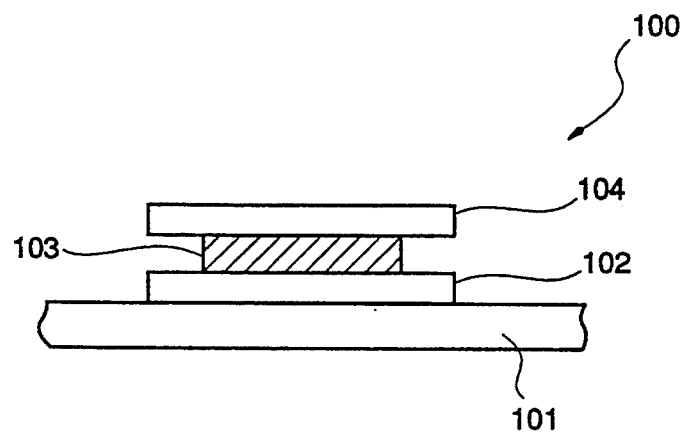
FIG. 1 depicts an antifuse element designed in accord with the methods of the present invention.

FIG. 1 shows a side cross-sectional view of an antifuse element 100 which is programmed according to the present invention. Antifuse element 100 comprises first electrode 102, antifuse dielectric layer 103, and second electrode 104. A combination of AC and DC electric fields is applied across first electrode 102 and second electrode 104 as described below to break down dielectric layer 103. The break down of dielectric layer 103 forms a conductive filament to electrically connect previously unconnected first electrode 102 and second electrode 104.

Substrate 101 is preferably a single crystal silicon wafer. Alternatively, substrate 101 may comprise a layer of silicon dioxide on a silicon substrate. First electrode 102 is formed upon substrate 101 according to well known fabrication methods. Polysilicon is the preferred material for use in fabricating first electrode 102, although it may be composed of metal or other material deposited or otherwise formed upon substrate 101. Alternatively, first electrode 102 may be formed by doping of an area of substrate 101 intended to serve as electrode 102.

Antifuse dielectric layer 103 is next deposited or otherwise formed upon first electrode 102. Preferably, dielectric layer 103 is a layered superlattice material as disclosed in co-pending U.S. patent application Ser. No. 08/154,927 filed Nov. 18, 1993 and which is hereby incorporated by reference. Strontium bismuth tantalate ($SrBi_2Ta_2O_9$) and barium bismuth tantalate ($BaBi_2Ta_2O_9$) are examples of preferred layered superlattice materials which may be used in antifuse dielectric layer 103. Initial results indicate that the breakdown or fusing voltage may be controlled by varying the strontium/bismuth ratio in strontium bismuth tantalate. Dielectric layer 103 may alternatively comprise a perovskite ferroelectric material of the form $ABO_3$, $A'A''BO_3$, $AB'B''O_3$, $A'A''B'B''O_3$, etc. Barium strontium titanate ($Ba_xSr_{1-x}TiO_3$), also known as BST, and the well-known ferroelectrics PZT and PLZT are examples of perovskite ferroelectric materials which may be used in antifuse dielectric layer 103. Preferably, dielectric layer 103 is comprised of a material which may be tuned for breakdown characteristics as well as resistivity. Many other ferroelectric materials may be used to form antifuse dielectric layer 103.

In the preferred embodiment, dielectric layer 103 is formed over first electrode 102 by depositing a liquid precursor, drying, and then annealing as recited in co-pending U.S. patent application Ser. No. 08/154,760 filed Nov. 18, 1993 which is hereby incorporated by reference. Alternatively, dielectric layer 103 may be formed over first electrode 102 by sputtering, chemical vapor deposition (CVD), or other known processes.

Second electrode 104 is formed on antifuse dielectric layer 103 and is preferably comprised of polysilicon or one or more metal layers formed by well known processes. Antifuse dielectric layer 103 serves as an insulator due to the high dielectric constant of materials selected for antifuse dielectric layer 103. First electrode 102 and second electrode 104 are manufactured unconnected as described above due to the insulation provided by antifuse dielectric layer 103. As will be discussed later, application of AC and DC electric fields across first electrode 102 and second electrode 104 of antifuse element 100 of FIG. 1 causes the breakdown of antifuse dielectric layer 103 to form a conductive filament completing the circuit between previously unconnected first electrode 102 and second electrode 104.

Figure 2:
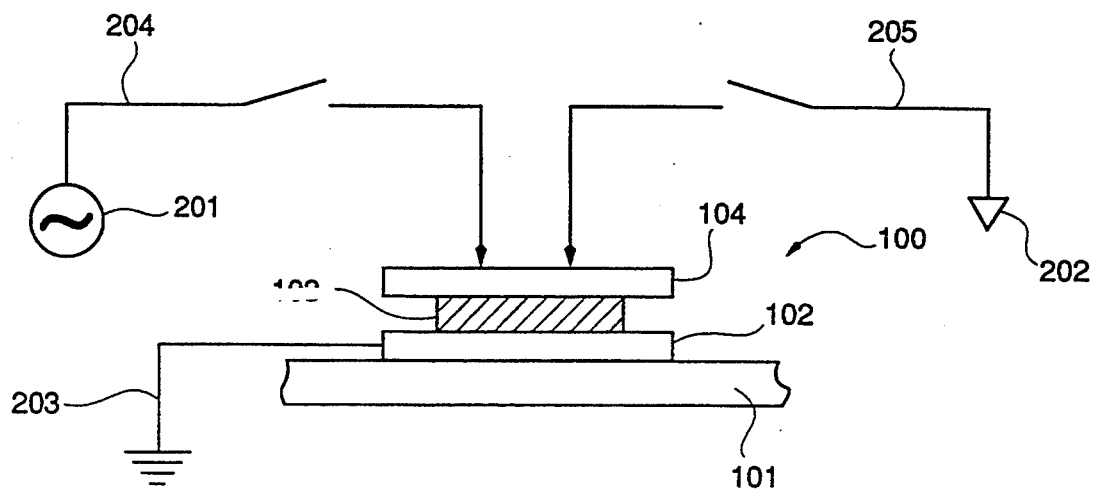
FIG. 2 shows an exemplary circuit used to program an antifuse element designed in accord with the methods of the present invention.

FIG. 2 depicts an exemplary circuit for programming a single antifuse element of the present invention. First electrode 102 of antifuse element 100 is connected to ground 203. AC source 201 is connected by wire 204 to second electrode 104 to provide an AC electric field across first electrode 102 and second electrode 104. DC source 202 is connected by wire 205 to second electrode 104 to provide a DC electric field across first electrode 102 and second electrode 104. The frequency and amplitude of the applied AC electric field is dependent on the material selected for antifuse dielectric layer 103 of FIG. 2. Typical frequency values may range from 10 Khz through 10 Mhz. A frequency is selected for the particular dielectric layer so as to reduce the amplitude of the applied DC electric field required to breakdown antifuse dielectric layer 103. The DC electric field is applied in pulses while the AC electric field is being continuously applied to the dielectric layer 103.

The efficacy of combining AC and DC electric fields to breakdown the dielectric layer 103 may be understood by the following. In a ferroelectric material, there is a spontaneous electric dipole moment. The applied AC electric field causes this dipole to oscillate, which produces heat, analogous to the way continuously bending a wire produces heat. When a DC electric field is placed on the ferroelectric, it causes the dipole moment to increase, which causes the heating effect to increase significantly. This can also be expressed in terms of the dielectric constant of a material, which is typically expressed as the complex number:

$$\epsilon = \epsilon_1 - i\epsilon_2, \quad (1)$$

where $\epsilon_1$ is the real part of the dielectric constant, i is the square root of a negative 1, and $\epsilon_2$ is the imaginary part of the dielectric constant. The electric current J is given by:

$$J = dD/dt = d(\epsilon E)/dt = d(\epsilon E_0 e^{i\omega t})/dt = -[(i\epsilon_1\omega) + (\epsilon_2\omega)]E \quad (2)$$

where D is the displacement vector and E is the electric field. As is known in the art, the imaginary part of J corresponds to the heating of the material with dielectric constant $\epsilon_1$ while the real part of J corresponds to the ordinary electrical current. Thus equation (2) indicates that the heating of the dielectric is proportional to $\epsilon_1\omega$. In a ferroelectric, $\epsilon_1$ increases dramatically with a small DC electric field. Thus the dielectric heating due to the AC electric field increases dramatically with a small applied DC electric field. Thus when a small DC electric field is pulsed across ferroelectric layer 103 while an AC electric field is being applied, the heating suddenly increases and the material fuses. Thus the combination of AC and DC electric fields permits the insulating layer to be broken down with a smaller field amplitudes than would be required using either DC or AC electric fields alone. Obviously, this effect will occur with any material in which the dielectric constant increases substantially with DC electric field, not just ferroelectric materials. A "substantial increase" as discussed above herein means an increase of at least a factor of two in response to the application of a DC electric field of less than 2 volts. Since ferroelectric materials generally have dielectric constants that increase significantly with the application of DC electric fields, these materials can be expected to work particularly well with the combination AC and DC electric fields.

Antifuse elements made in accordance with the teachings of the present invention require a smaller DC electric field than prior antifuse designs to cause the breakdown of the insulating material to form a conductive filament between the previously unconnected points. It takes energy to create the AC electric field, and one can consider this energy to be stored in the oscillations temporarily. Then when the DC electric field is applied, the energy in the oscillations suddenly is converted into heat energy which fuses the material. Thus, the amplitude of the applied DC electric field is greatly reduced over that which would be required to breakdown the dielectric material in the absence of an AC electric field. The precise amplitude of the applied DC electric field, the number of pulses, and the duration of the pulses required to breakdown the dielectric layer will vary depending on the material selected for the dielectric layer. For ferroelectric materials such as discussed above, the amplitude of the AC electric field oscillates between 1 and 10 volts and the DC electric field is in a range of 0.5 to 5 volts. Preferably the AC electric field has a amplitude of about 5 volts and the DC electric field has a amplitude below 2 volts.

Figure 3:
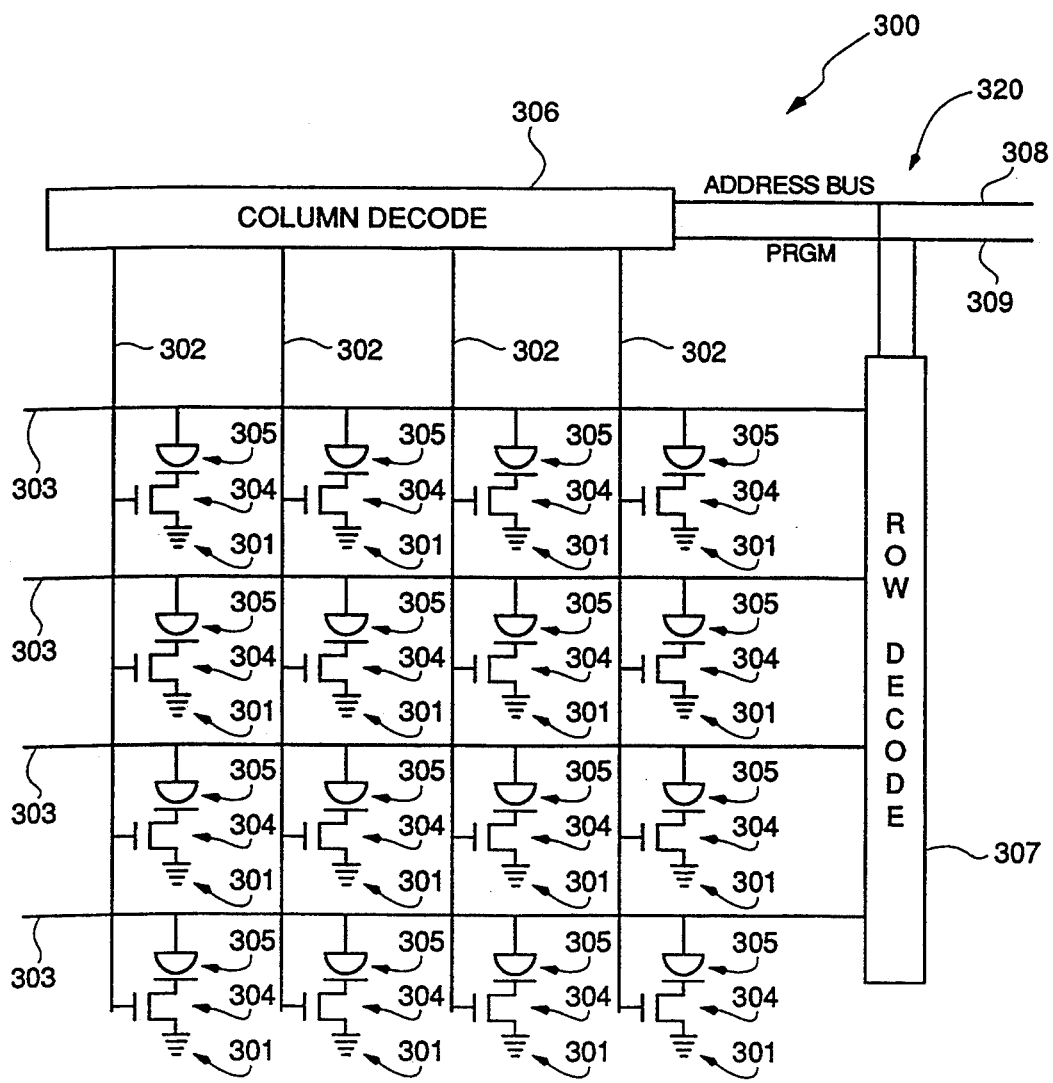
FIG. 3 shows an exemplary application of a matrix of antifuse elements arranged with associated address decoding circuits to form a PROM.

FIG. 3 shows a typical application of a two-dimensional matrix of antifuse elements in association with other components to implement a programmable read-only memory 300 (PROM). PROM 300 is an OTP device comprising a 4×4 array of memory cells which may be programmed once to record a binary digit at each memory cell 301 and later may be accessed to read the recorded binary digit. A memory cell 301 is formed at each intersection of one word line 302 and one bit line 303. Each memory cell 301 comprises an N-channel transistor 304 and a ferroelectric antifuse element 305 as discussed above. FIG. 3 shows one end of each antifuse element 305 attached to a corresponding bit line 303. The other end of each antifuse element 305 is attached to the drain of N-channel transistor 304. The drain of each N-channel transistor 304 is manufactured to be initially disconnected from the corresponding bit line 303. By programming the corresponding antifuse element 305 (as discussed below) the drain of an N-channel transistor 304 is connected to the corresponding bit line 303. The gate of each N-channel transistor 304 is attached to a corresponding word line 302 and the source of each N-channel transistor 304 is attached to ground. To sense the stored binary digit from a memory cell 301, a voltage sufficient to turn on the desired transistor is applied to the gate of the N-channel transistor 304 over word line 302. Simultaneously, a voltage is applied to the bit line 303 attached to the antifuse element 305 associated with the desired transistor. If the associated antifuse element 305 has been programmed to connect the selected bit line 303 to the drain of the N-channel transistor, then bit line 303 will be pulled to ground indicating a logic 0 value is stored in the memory cell 301. If the associated antifuse element 305 has not been programmed, bit line 303 will remain at the applied voltage indicating a logic 1 value is stored in the memory cell 301.

In the unprogrammed state, each memory cell 301 contains a logic "1" bit. To program a memory cell 301 to contain a logic "0" bit, a voltage sufficient to turn on the desired transistor is applied to the gate of the N-channel transistor 304 over word line 302. This connects one end of the unprogrammed associated antifuse element 305 to ground through the transistor. Simultaneously, AC and DC electric fields are applied to the bit line 303 attached to the opposite end of the unprogrammed antifuse element 305 associated with the desired transistor. As described above, the combination of AC and DC electric fields across the electrodes of antifuse element 305 will cause the ferroelectric insulative layer within antifuse element 305 to fuse and thus "program" the element to a logic "0".

Column decode logic 306 selects a desired word line 302 and applies the required voltage to sense or program a selected memory cell based on the linear address supplied on address bus 308. Row decode logic 307 selects a desired bit line 303 and applies the required electric fields to sense or program a selected memory cell based on the linear address supplied on address bus 308. Row decode logic 307 applies the required programming electric fields when the PRGM pin 309 is sensed active.

There has been described a novel method and apparatus for programming antifuse elements using combined AC and DC electric fields. It should be understood that the particular embodiments shown in the drawings and described within this specification are for purposes of example and should not be construed to limit the invention. Further, it is evident that those skilled in the art may now make numerous uses and modifications of the specific embodiment described, without departing from the inventive concepts. For example, the method and apparatus may be applied with a wide variety of structures fabricated using a wide variety of processes. Equivalent circuits may be used, different electric field amplitudes may be used, and the frequency and timing of the applied electric fields may be different. It is also evident that the process steps recited may in some instances be performed in a different order. Or equivalent structures and processes may be substituted for the various structures and processes described.

We claim:

1. A method for programming an antifuse element, said antifuse element comprising two electrodes separated by a dielectric material layer, said method comprising the steps of:
   applying an AC electric field of predetermined AC amplitude across said two electrodes for a first period of time; and
   applying a DC electric field of predetermined DC amplitude across said two electrodes to alter said dielectric material layer to electrically connect said two electrodes for a second period of time, wherein at least a portion of said first period of time is simultaneous with said second period of time whereby the application of said AC electric field is coincident with the application of said DC electric field.

2. The method of claim 1 wherein said dielectric material layer comprises a ferroelectric material.

3. The method of claim 1 wherein said dielectric material layer comprises barium strontium titanate ($Ba_xSr_{1-x}TiO_3$).

4. The method of claim 1 wherein the amplitude of said AC electric field is from 1 to 10 volts.

5. The method of claim 1 wherein the amplitude of said AC electric field is 5 volts.

6. The method of claim 1 wherein said AC electric field oscillates at a frequency between 10,000 hertz and 10,000,000 hertz.

7. The method of claim 1 wherein said DC electric field has an amplitude of between 0.5 volts and 5 volts.

8. The method of claim 1 wherein said DC electric field has an amplitude of less than 2 volts.

9. A method for programming an antifuse element, said antifuse element comprising two electrodes separated by an insulative ferroelectric dielectric material layer, said method comprising the steps of:
applying an AC electric field of predetermined AC amplitude across said two electrodes for a first period of time; and
applying a DC electric field of predetermined DC amplitude across said two electrodes to breakdown said ferroelectric dielectric material layer to electrically connect said two electrodes for a second period of time, wherein at least a portion of said first period of time is simultaneous with said second period of time whereby the application of said AC electric field is coincident with the application of said DC electric field.

10. The method of claim 9 wherein said ferroelectric dielectric material layer comprises barium strontium titanate ($Ba_xSr_{1-x}TiO_3$).

11. The method of claim 9 wherein the amplitude of said AC electric field is from 1 to 10 volts.

12. The method of claim 9 wherein the amplitude of said AC electric field is 5 volts.

13. The method of claim 9 wherein said AC electric field oscillates at a frequency between 10,000 hertz and 10,000,000 hertz.

14. The method of claim 9 wherein said DC electric field has an amplitude of between 0.5 volts and 5 volts.

15. The method of claim 9 wherein said DC electric field has an amplitude of less than 2 volts.

16. An electrically programmable antifuse device comprising:
first and second electrodes;
a dielectric layer electrically insulating said first and second conductive electrodes; and
fusing means for controllably altering said dielectric layer to form an electrical conductor connecting said first and second conductive electrodes, said fusing means further comprising:
means for controllably applying an AC electric field of predetermined AC amplitude across said first and second conductive electrodes for a first period of time; and
means for controllably applying a DC electric field of predetermined DC amplitude across said first and second conductive electrodes for a second period of time, wherein at least a portion of said first period of time is simultaneous with said second period of time whereby the application of said AC electric field is coincident with the application of said DC electric field.

17. The programmable antifuse device of claim 16 wherein said dielectric layer comprises a material having a dielectric constant that increases substantially when a DC electric field is applied across said dielectric layer.

18. A programmable array integrated circuit comprising:
a substrate material;
a plurality of row electrode means formed in substantially parallel rows on said substrate material;
a plurality of column electrode means formed in substantially parallel columns substantially perpendicular to said plurality of row electrode means, each of said plurality of column electrodes intersecting the plane of each of said plurality of row electrodes;
dielectric means for electrically insulating each of said intersecting row and column electrode means; and
fusing means for controllably altering said dielectric means at any one of said intersections of said row and column electrode means to form an electrical conductor connecting said one of said intersecting row and column electrode means, said fusing means further comprising:
means for controllably applying an AC electric field of predetermined AC amplitude across said one of said intersecting row and column electrode means for a first period of time; and
means for controllably applying a DC electric field of predetermined DC amplitude across said one of said intersecting row and column electrode means for a second period of time, wherein at least a portion of said first period of time is simultaneous with said second period of time whereby the application of said AC electric field is coincident with the application of said DC electric field.

19. The programmable array integrated circuit of claim 18 wherein said dielectric insulating means comprises a material having a dielectric constant that increases substantially when a DC electric field is applied across said dielectric layer.

* * * * *